(12) United States Patent
Kalutarage et al.

(10) Patent No.: US 12,068,170 B2
(45) Date of Patent: *Aug. 20, 2024

(54) VAPOR PHASE THERMAL ETCH SOLUTIONS FOR METAL OXO PHOTORESISTS

(71) Applicant: Applied Materials, Inc., Santa Clara, CA (US)

(72) Inventors: Lakmal Charidu Kalutarage, San Jose, CA (US); Mark Joseph Saly, Milpitas, CA (US); Bhaskar Jyoti Bhuyan, Milpitas, CA (US); Madhur Sachan, Belmont, CA (US); Regina Freed, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/198,743

(22) Filed: May 17, 2023

(65) Prior Publication Data

US 2023/0290646 A1 Sep. 14, 2023

Related U.S. Application Data

(63) Continuation of application No. 18/116,556, filed on Mar. 2, 2023, which is a continuation of application
(Continued)

(51) Int. Cl.
*H01L 21/3213* (2006.01)
*C23F 4/02* (2006.01)
(Continued)

(52) U.S. Cl.
CPC .......... *H01L 21/32135* (2013.01); *C23F 4/02* (2013.01); *G03F 7/0042* (2013.01);
(Continued)

(58) Field of Classification Search
None
See application file for complete search history.

(56) References Cited

U.S. PATENT DOCUMENTS 3,837,944 A 9/1974 Cole, Jr.
4,283,482 A 8/1981 Hattori et al.
(Continued)

FOREIGN PATENT DOCUMENTS

CN 108351594 A 7/2018
EP 0090615 A2 10/1983
(Continued)

OTHER PUBLICATIONS

International Search Report and Written Opinion from International Patent Application No. PCT/US2021/038424 dated Oct. 14, 2021, 9 pgs.
(Continued)

*Primary Examiner* — Jiong-Ping Lu
(74) *Attorney, Agent, or Firm* — Schwabe, Williamson & Wyatt, P.C.

(57) ABSTRACT

Embodiments disclosed herein include methods of developing a metal oxo photoresist. In an embodiment, the method comprises providing a substrate with the metal oxo photoresist into a vacuum chamber, where the metal oxo photoresist comprises exposed regions and unexposed regions. In an embodiment, the unexposed regions comprise a higher carbon concentration than the exposed regions. The method may further comprise vaporizing a halogenating agent into the vacuum chamber, where the halogenating agent reacts with either the unexposed regions or the exposed regions to produce a volatile byproduct. In an embodiment, the method may further comprise purging the vacuum chamber.

10 Claims, 8 Drawing Sheets

Related U.S. Application Data

No. 17/348,589, filed on Jun. 15, 2021, now Pat. No. 11,621,172.

(60) Provisional application No. 63/047,157, filed on Jul. 1, 2020.

(51) Int. Cl.
*G03F 7/004* (2006.01)
*G03F 7/26* (2006.01)
*G03F 7/36* (2006.01)

(52) U.S. Cl.
CPC ............ *G03F 7/0043* (2013.01); *G03F 7/265* (2013.01); *G03F 7/36* (2013.01)

(56) References Cited

U.S. PATENT DOCUMENTS

| | | |
|---|---|---|
| 4,292,384 A | 9/1981 | Straughan et al. |
| 4,320,191 A | 3/1982 | Yoshikawa et al. |
| 4,332,879 A | 6/1982 | Pastor et al. |
| 4,464,455 A | 8/1984 | Yoneda et al. |
| 4,560,641 A | 12/1985 | Kokaku et al. |
| 4,842,989 A | 6/1989 | Taniguchi et al. |
| 5,310,624 A | 5/1994 | Ehrlich |
| 5,366,852 A | 11/1994 | Pavelchek et al. |
| 5,439,780 A | 8/1995 | Joshi et al. |
| 5,457,005 A | 10/1995 | Babich et al. |
| 5,763,016 A | 6/1998 | Levenson et al. |
| 5,885,751 A | 3/1999 | Weidman et al. |
| 6,204,168 B1 | 3/2001 | Naik et al. |
| 6,589,715 B2 | 7/2003 | Joubert et al. |
| 6,825,562 B2 | 11/2004 | Naik et al. |
| 6,855,485 B2 | 2/2005 | Irie |
| 6,989,227 B2 | 1/2006 | Weldman et al. |
| 7,064,076 B2 | 6/2006 | Kulkarni |
| 7,713,678 B2 | 5/2010 | Hosoda |
| 7,771,895 B2 | 8/2010 | Wu et al. |
| 8,465,903 B2 | 6/2013 | Weidman et al. |
| 8,536,068 B2 | 9/2013 | Weidman et al. |
| 8,709,706 B2 | 4/2014 | Wu et al. |
| 8,940,386 B2 | 1/2015 | Ohtani et al. |
| 9,229,326 B2 | 1/2016 | Lu et al. |
| 9,310,684 B2 | 4/2016 | Meyers et al. |
| 9,354,508 B2 | 5/2016 | Beasley et al. |
| 9,411,237 B2 | 8/2016 | Xie et al. |
| 9,417,515 B2 | 8/2016 | Barman et al. |
| 9,470,980 B2 | 10/2016 | Inoue et al. |
| 9,632,411 B2 | 4/2017 | Michaelson et al. |
| 9,778,561 B2 | 10/2017 | Marks et al. |
| 9,829,805 B2 | 11/2017 | Michaelson et al. |
| 9,996,004 B2 | 6/2018 | Smith et al. |
| 10,228,618 B2 | 3/2019 | Meyers et al. |
| 10,642,153 B2 | 5/2020 | Meyers |
| 10,658,180 B1 | 5/2020 | Mignot |
| 10,787,466 B2 | 9/2020 | Edson |
| 10,831,096 B2 | 11/2020 | Marks et al. |
| 11,599,022 B2 | 3/2023 | Stowers et al. |
| 11,621,172 B2 | 4/2023 | Kalutarage |
| 2001/0008227 A1 | 7/2001 | Sadamoto et al. |
| 2001/0009154 A1 | 7/2001 | Nguyen et al. |
| 2004/0091618 A1 | 5/2004 | Park |
| 2004/0214113 A1 | 10/2004 | Goldstein |
| 2008/0014533 A1 | 1/2008 | Keller et al. |
| 2011/0294072 A1 | 12/2011 | Park et al. |
| 2012/0088193 A1 | 4/2012 | Weidman et al. |
| 2012/0322015 A1 | 12/2012 | Kim |
| 2014/0263172 A1 | 9/2014 | Xie et al. |
| 2014/0356770 A1 | 12/2014 | Hayashi |
| 2015/0056542 A1 | 2/2015 | Meyers et al. |
| 2015/0200091 A1 | 7/2015 | Chada et al. |
| 2015/0270140 A1 | 9/2015 | Gupta et al. |
| 2016/0011502 A1 | 1/2016 | Hofmann |
| 2016/0116839 A1 | 4/2016 | Meyers et al. |
| 2016/0329222 A1 | 11/2016 | Xie et al. |
| 2016/0379833 A1 | 12/2016 | Hong et al. |
| 2017/0146909 A1 | 5/2017 | Smith et al. |
| 2017/0186614 A1 | 6/2017 | Ko et al. |
| 2017/0261850 A1 | 9/2017 | Stowers et al. |
| 2017/0271152 A1 | 9/2017 | Char |
| 2018/0173096 A1 | 6/2018 | Zi et al. |
| 2018/0307137 A1 | 10/2018 | Meyers et al. |
| 2019/0131130 A1 | 5/2019 | Smith et al. |
| 2019/0153001 A1 | 5/2019 | Cardineau |
| 2019/0198325 A1 | 6/2019 | Briggs et al. |
| 2019/0308998 A1 | 10/2019 | Cardineau |
| 2019/0315781 A1 | 10/2019 | Edson |
| 2019/0337969 A1 | 11/2019 | Odedra |
| 2019/0384171 A1 | 12/2019 | Zi et al. |
| 2020/0051807 A1 | 2/2020 | Singhal et al. |
| 2020/0064733 A1 | 2/2020 | Meyers |
| 2020/0073238 A1 | 3/2020 | Zi et al. |
| 2020/0176246 A1 | 6/2020 | Huotari |
| 2020/0223877 A1 | 7/2020 | Odedra |
| 2020/0239498 A1 | 7/2020 | Clark |
| 2020/0241413 A1 | 7/2020 | Clark |
| 2020/0326627 A1 | 10/2020 | Jiang et al. |
| 2021/0305028 A1 | 9/2021 | Guo et al. |
| 2022/0004105 A1 | 1/2022 | Dai |
| 2022/0020584 A1 | 1/2022 | Volosskiy |
| 2022/0244645 A1 | 8/2022 | Tan et al. |
| 2022/0306657 A1 | 9/2022 | Fabulyak et al. |
| 2022/0308447 A1 | 9/2022 | Stowers et al. |
| 2022/0344136 A1 | 10/2022 | Peter et al. |
| 2023/0019943 A1 | 1/2023 | Nakabayashi et al. |
| 2023/0078946 A1 | 3/2023 | Grzeskowiak et al. |
| 2023/0100995 A1 | 3/2023 | Cardineau et al. |
| 2023/0143629 A1 | 5/2023 | Clark |
| 2023/0152705 A1 | 5/2023 | Grzeskowiak et al. |
| 2023/0197505 A1 | 6/2023 | Lutker-Lee et al. |
| 2023/0215736 A1 | 7/2023 | Kalutarage |
| 2023/0290646 A1 | 9/2023 | Kalutarage |

FOREIGN PATENT DOCUMENTS

| | | | |
|---|---|---|---|
| EP | 0100079 A2 | 2/1984 | |
| EP | 1033744 A2 | 9/2000 | |
| EP | 2926199 B1 | 9/2020 | |
| JP | 05100425 | 4/1993 | |
| JP | 08320574 A | 12/1996 | |
| JP | 2014209622 A | 11/2014 | |
| JP | 2017116923 A | 6/2017 | |
| JP | 2019500490 A | 1/2019 | |
| JP | 2020510994 | 4/2020 | |
| KR | 1020220025020 | 3/2022 | |
| KR | 1020220025885 | 3/2022 | |
| TW | 2014/43271 | 11/2014 | |
| TW | 2016/01444 | 1/2016 | |
| TW | 2016/35334 | 10/2016 | |
| TW | 2018/41258 | 11/2018 | |
| TW | 201842537 A | 12/2018 | |
| TW | 202006168 | 2/2020 | |
| TW | 202016279 A | 5/2020 | |
| TW | 2021/17468 | 5/2021 | |
| WO | WO 2004-095551 | 11/2004 | |
| WO | WO 2018-004646 | 1/2018 | |
| WO | 2019217749 A1 | 11/2019 | |
| WO | WO 2019217749 | 11/2019 | |
| WO | 202008143 A1 | 4/2020 | |
| WO | WO 2020081483 | 4/2020 | |
| WO | WO2020132281 | * 6/2020 | ............... G03F 7/36 |
| WO | 2020264158 A1 | 12/2020 | |
| WO | WO 2020-264557 | 12/2020 | |
| WO | WO 2020-264571 | 12/2020 | |
| WO | WO2020264158 | * 12/2020 | ............... G03F 7/36 |
| WO | WO 2021-072042 | 4/2021 | |
| WO | WO 2021-146138 | 7/2021 | |
| WO | WO 2021158433 | 8/2021 | |
| WO | WO 2021-202146 | 10/2021 | |
| WO | WO 2022103764 | 5/2022 | |

(56) References Cited

FOREIGN PATENT DOCUMENTS

| WO | WO 2022265874 | 12/2022 |
| WO | 2023/009364 A1 | 2/2023 |

OTHER PUBLICATIONS

Non-Final Office Action from U.S. Appl. No. 17/348,589 dated Jul. 28, 2022, 11 pgs.
International Preliminary Report on Patentability from Patent Application No. PCT/US2021/038424 dated Jan. 12, 2023, 6 pgs.
Official Letter from Taiwan Patent Application No. 110124241 dated Mar. 28, 2023, 10 pgs.
Official Letter from Taiwan Patent Application No. 112128099 dated Sep. 22, 2023, 7 pgs.
Floy Chang, et al., "Gas-phase Silicon micromachining with xenon difluoride", Proceedings of SPIE, Downloaded from: https://www.spiedigitallibrary.org/conference-proceedings-of-spie. Jul. 13, 2023, pp. 117-128.
Shigeyasu Mori, et al., "Prediction of Resolution using wet-develop type single layer and dry-development process for EUV lithography", Microelectronic Engineering 53 (2000), pp. 689-692.
Gediminas Seniutinas, "Development of high-resolution 3D nanotechnology tools: sensors focus", Faculty of Science, Engineering and Technology, Swinburne University of Technology, 2016, pp. 1-82, 91-123, 129-187, 213-261.
Hiroshi Ito, et al. "Chemical Amplification in the Design of Dry Developing Resist Materials", Polymer Engineering and Science, Dec. 1983, vol. 23, No. 18, pp. 1012-1018.
Theodore Manouras, et al. "High Sensitivity Resists for EUV Lithography: A Review of Material Design Strategies and Performance Results". nanomaterials Aug. 14, 2020, pp. 1-24.
Jason K. Stowers, "Direct Patterning of Solution Deposited Metal Oxides", Aug. 14, 2008, pp. 1-149.
T.W. Weidman, et al. "Applications of Plasma Polymerized Methylsilane as a Resist and Silicon Dioxide Precursor for 193 and 248 nm Lithography", SPIE vol. 2438. Jun. 9, 1995, pp. 496-503.
Matthew L. Wagner, et al. "The Use of HBr in Polysilicon Etching", Gases & Instrumentation International, vol. 7, Issue 4, Jul./Aug. 2013, pp. 1-7.
Non-final office action from U.S. Appl. No. 18/116,556 dated Dec. 5, 2023, 25 pgs.
Official Letter from Taiwan Patent Application No. 112128099 dated Dec. 22, 2023, 6 pgs.
Notice of Reasons for Rejection from Japanese Patent Application No. 2022-580825 dated Jan. 23, 2024, 8 pgs.
Notice of Reasons for Rejection from Japanese Patent Application No. 2022-580826 dated Feb. 26, 2024, 8 pgs.
Notice to File a Response from Korean Patent Application No. 10-2023-7003446 dated Jun. 19, 2024, 6 pgs.
International Search Report and Written Opinion from PCT/US2024/012192 dated May 13, 2024, 10 pgs.
International Search Report and Written Opinion from PCT/US2023/032497 dated Jan. 3, 2024, 9 pgs.
"List of Reactive Gases," https://sps-support.honeywell.com/s/article/List-of-reactive-gases Aug. 23, 2019.
Niibe, Masahito, et al., "Competitive reactions of carbon deposition and oxidation on the surface of Mo/Si multilayer mirrors by EUV Irradiation," Proceedings of the SPIE, vol. 7361, May 2009, pp. 1-8.
Krysak, Marie, et al., "Development of an Inorganic Nanoparticle Photoresist for EUV, E-beam and 193 nm Lithography." Proceedings of SPIE vol. 7972, 2011, pp. 1-6.
Cardineau, Brian, et al., "EUV resists based on tin-oxo clusters," Proceedings of SPIE Advanced Lithography, 2014, pp. 1-12.
Buitrago, Elizabeth, et al., "SnOx high-efficiency EUV interference lithography gratings towards the ultimate resolution in photolithography," Elsevier, Microelectronic Engineering 155, 2016, pp. 44-49.
International Preliminary Report on Patentability from PCT/UC2021/038758 dated Jan. 12, 2023, 6 pgs.
International Search Report and Written Opinion from PCT/US2021/038758 dated Oct. 15, 2021, 10 pgs.
Non-Final Office Action from U.S. Appl. No. 18/116,556 dated Aug. 1, 2023, 9 pgs.
Final Office Action from U.S. Appl. No. 17/349,534 dated Mar. 10, 2023, 24 pgs.
Non-Final Office Action from U.S. Appl. No. 17/349,534 dated Sep. 19, 2022, 14 pgs.
Non-Final Office Action from U.S. Appl. No. 17/349,534 dated Jul. 6, 2023, 16 pgs.
Final Office Action from U.S. Appl. No. 17/349,534 dated Nov. 29, 2023, 21 pgs.
Final Office Action from U.S. Appl. No. 18/198,743 dated Mar. 6, 2024, 20 pgs.
Notice of Reasons for Rejection from Japan Patent Application No. 2022-580826 dated Feb. 26, 2024, 8 pgs.
Official Action from Taiwan Patent Application No. 112128099 dated Mar. 22, 2024, 5 pgs.
Official Letter from Taiwan Patent Application No. 110123956 dated Jun. 2, 2023, 12 pgs.
Official Action from Taiwan Patent Application No. 110123956 dated Apr. 16, 2024, 12 pgs.
Notice to File a Response from Korean Patent Application No. 10-2023-7003603 dated Jun. 26, 2024, 12 pgs.

* cited by examiner

VAPOR PHASE THERMAL ETCH SOLUTIONS FOR METAL OXO PHOTORESISTS

CROSS-REFERENCE TO RELATED APPLICATIONS

This application is a continuation of U.S. patent application Ser. No. 18/116,556, filed on Mar. 2, 2023, which is a continuation of U.S. patent application Ser. No. 17/348,589, filed on Jun. 15, 2021, which claims the benefit of U.S. Provisional Application No. 63/047,157, filed on Jul. 1, 2020, the entire contents of which are hereby incorporated by reference herein.

BACKGROUND

1) Field

Embodiments of the present disclosure pertain to the field of semiconductor processing and, in particular, to methods of developing a metal oxo photoresist using vapor phase processes.

2) Description pf Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent. The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist is removed (etched). Now the photoresist is developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments disclosed herein include methods of developing a metal oxo photoresist. In an embodiment, the method comprises providing a substrate with the metal oxo photoresist into a vacuum chamber, where the metal oxo photoresist comprises exposed regions and unexposed regions. In an embodiment, the unexposed regions comprise a higher carbon concentration than the exposed regions. The method may further comprise vaporizing a halogenating agent into the vacuum chamber, where the halogenating agent reacts with either the unexposed regions or the exposed regions to produce a volatile byproduct. In an embodiment, the method may further comprise purging the vacuum chamber.

A method of developing a metal oxo photoresist may also comprise, providing a substrate with the metal oxo photoresist into a vacuum chamber, where the metal oxo photoresist comprises exposed regions and unexposed regions. In an embodiment, the unexposed regions comprise a higher carbon concentration than the exposed regions. The method may further comprise vaporizing a halogenating agent into the vacuum chamber, where the halogenating agent reacts with either the unexposed regions or the exposed regions to produce a non-volatile product. In an embodiment, the method may further comprise vaporizing a ligand into the vacuum chamber, where the ligand reacts with the non-volatile product to produce a volatile byproduct. In an embodiment, the method may further comprise purging the vacuum chamber.

A method of developing a metal oxo photoresist may also comprise, providing a substrate with the metal oxo photoresist into a vacuum chamber, where the metal oxo photoresist comprises exposed regions and unexposed regions. In an embodiment, the unexposed regions comprise a higher carbon concentration than the exposed regions. The method may further comprise vaporizing an organic acid into the vacuum chamber, where the organic acid reacts with either the unexposed regions or the exposed regions to produce a volatile byproduct. In an embodiment, the method may further comprise purging the vacuum chamber.

DETAILED DESCRIPTION

Figure 1:
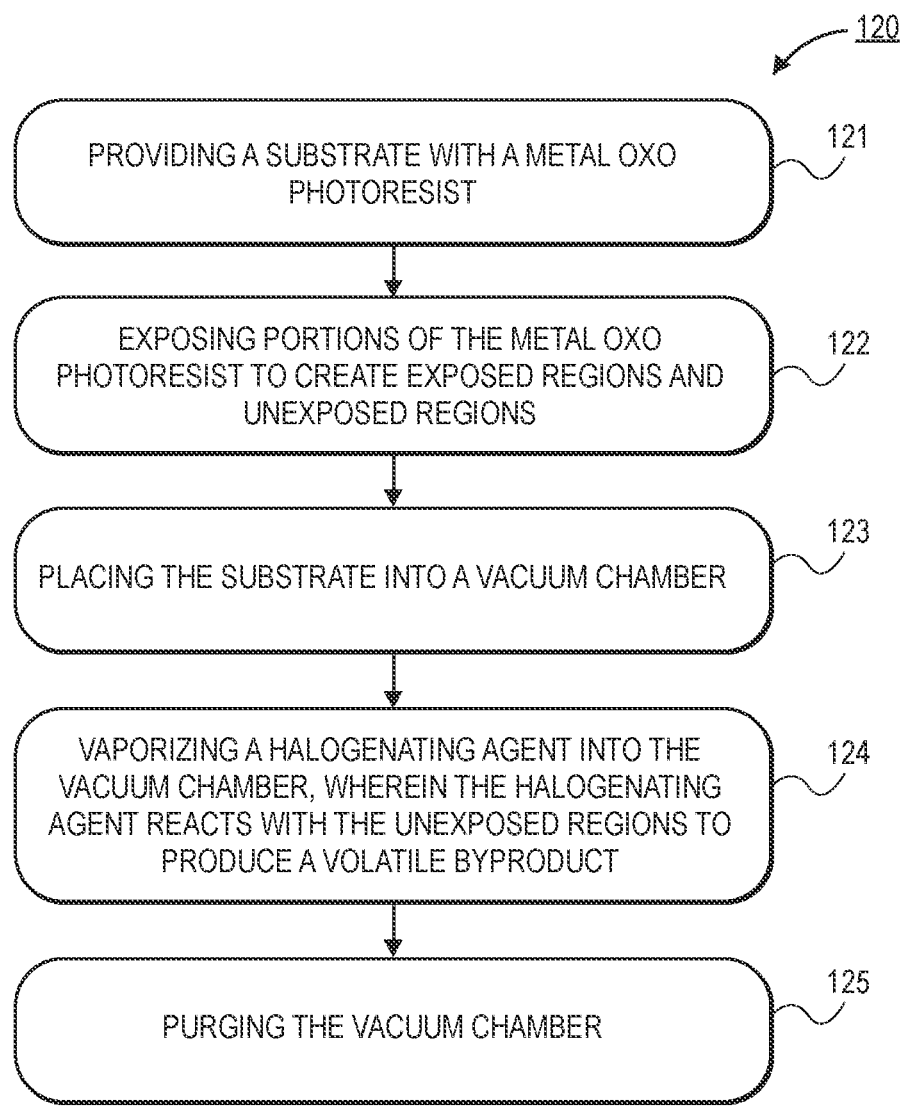
FIG. 1 is a flowchart describing a process for developing a metal oxo photoresist using a vapor phase process with a halogenating agent, in accordance with an embodiment of the present disclosure.

Methods of developing a metal oxo photoresist using vapor phase processes are described herein. In the following description, numerous specific details are set forth, such as thermal vapor phase processes and material regimes for developing photoresist, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, photoresist systems used in extreme ultraviolet (EUV) lithography suffer from low efficiency. That is, existing photoresist material systems for EUV lithography require high dosages in order to provide the needed solubility switch that allows for developing the photoresist material. Organic-inorganic hybrid materials (e.g., metal oxo materials systems) have been proposed as a material system for EUV lithography due to the increased sensitivity to EUV radiation. Such material systems typically comprise a metal (e.g., Sn, Hf, Zr, etc.), oxygen, and carbon. Metal oxo based organic-inorganic hybrid materials have also been shown to provide lower LER and higher resolution, which are required characteristics for forming narrow features.

In a metal oxo photoresist system, exposure to EUV radiation results in the removal of carbon. The difference in the carbon percentage between the exposed regions and the unexposed regions is used as the solubility switch during developing. Particularly, the unexposed regions with the higher carbon content are preferentially etched by the developer solution in a negative tone develop.

Metal oxo photoresist systems are currently developed using a wet chemistry. That is, after exposure, the unexposed regions of the photoresist are developed by organic solvents/base solution that is used with spin-dry process. A post-bake anneal may also be included. However, wet methods can be troublesome when dealing with high aspect ratio features due to the risk of pattern collapse (especially in line or pillar structures). Additionally, wet processes might not remove all of the material that is supposed to be removed and film materials/byproducts/solvents and the like may be trapped in small features.

Accordingly, embodiments of the present disclosure provide a vapor phase thermal etching process to develop metal oxo photoresists. Particularly, vapor phase thermal etching processes provide the advantages of: 1) eliminating the generation of wet byproducts; 2) providing fewer defects and impurities; 3) lower waste streams due to dry chemistry being destroyed in an abatement system; 4) improvement of LER; and 5) less damage with dry thermal etch when compared to plasma damage in reactive ion etching (RIE). For example, at a pitch less than 30 nm (e.g., line CD less than 14 nm) and less than 15 nm photoresist thickness, a plasma can potentially damage the photoresist mask which may result in poor LER/LWR or even a broken line pattern when the pattern is transferred to the underlayer.

Embodiments disclosed herein provide various vapor phase thermal etching processes that are executed after portions of a metal oxo photoresist are exposed with a suitable electromagnetic radiation source (e.g., an EUV source). In a first embodiment, the vapor phase thermal etching process includes vaporizing a halogenating agent into a vacuum chamber. The halogenating agent reacts with either the unexposed or exposed regions of the photoresist to produce a volatile byproduct that is removed from the vacuum chamber. In a second embodiment, the vapor phase thermal etching process includes vaporizing a halogenating agent into a vacuum chamber. The halogenating agent may react with either the unexposed or exposed regions of the photoresist to produce a non-volatile product. A ligand may then be vaporized into the chamber, and the ligand reacts with the non-volatile product to provide a volatile byproduct that can be removed from the vacuum chamber. In a third embodiment, the vapor phase thermal etching process includes vaporizing an organic acid into a vacuum chamber. The organic acid reacts with either the unexposed or exposed regions of the photoresist to produce a volatile byproduct that is removed from the vacuum chamber.

Figure 2A:
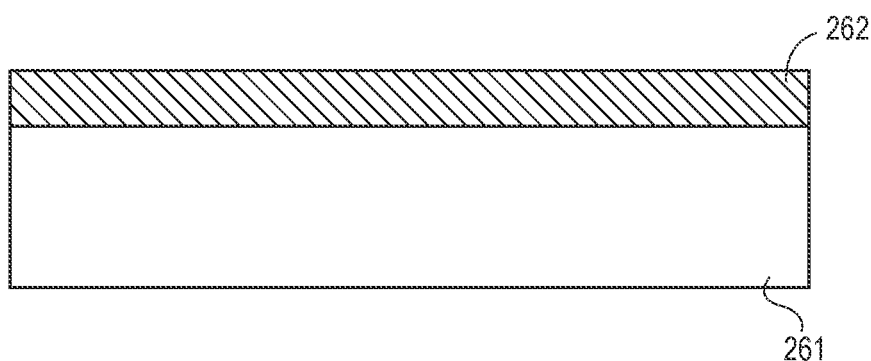
FIGS. 2A-2C are cross-sectional illustrations of a substrate and a photoresist depicting operations in the flowchart of FIG. 1, in accordance with an embodiment of the present disclosure.
Figure 2B:
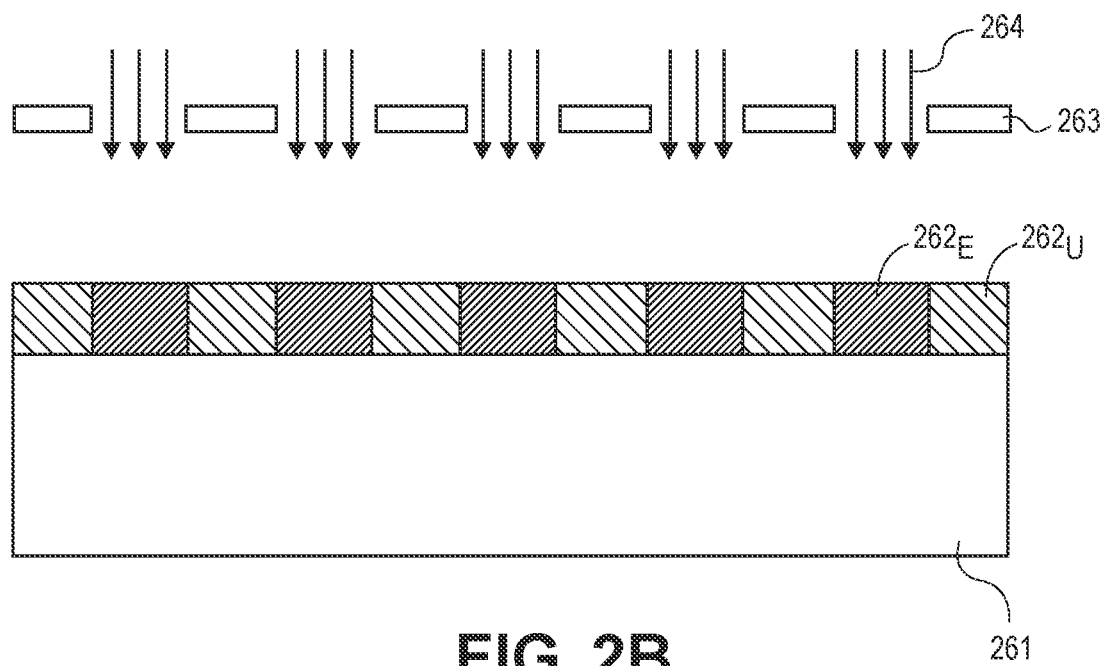
Figure 2C:
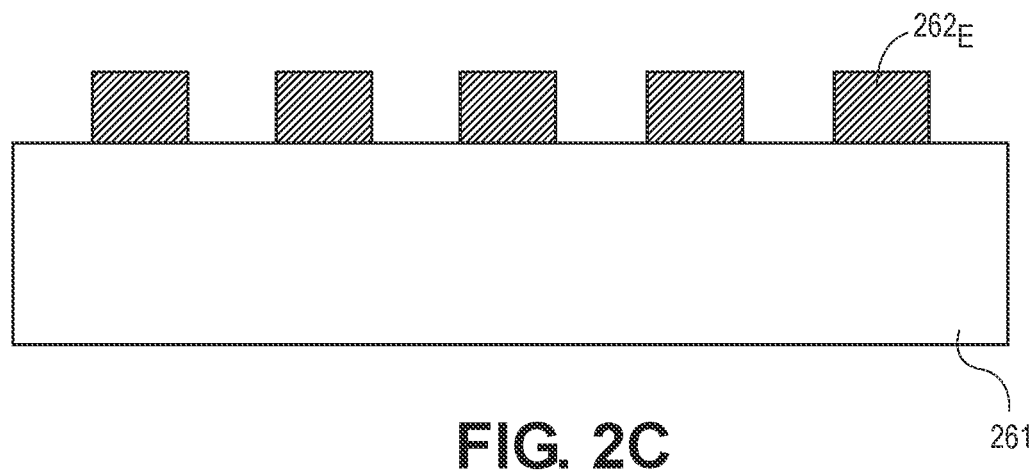

Referring now to FIG. 1, a flowchart illustrating a process 120 for developing a metal oxo photoresist on a substrate surface is provided, in accordance with an embodiment of the present disclosure. FIGS. 2A-2C are cross-sectional illustrations of a substrate 261 and a metal oxo photoresist 262 after various operations in process 120.

In an embodiment, process 120 may begin with operation 121 which comprises providing a substrate with a metal oxo photoresist. FIG. 2A is a cross-sectional illustration of a substrate 261 with a metal oxo photoresist 262 disposed over a surface of the substrate 261. In an embodiment, the substrate 261 may comprise any substrate material or materials typical of semiconductor manufacturing environments. For example, the substrate 261 may comprise a semiconducting material. Substrate 261 may comprise semiconductor devices or portions of semiconductor devices. Examples of such semiconductor devices include, but are not limited to, memory devices or complimentary metal-oxide-semiconductor (CMOS) transistors fabricated in a silicon substrate and encased in a dielectric layer. The substrate 261 may also comprise a plurality of metal interconnects formed above the devices or transistors, and in surrounding dielectric layers, and may be used to electrically couple the devices or transistors to form integrated circuits. In an embodiment, the substrate 261 may be a wafer.

In an embodiment, the metal oxo photoresist 262 (also referred to simply as "photoresist 262"), may be any metal oxo material system. Such material systems typically comprise a metal (e.g., Sn, Hf, Zr, etc.), oxygen, and carbon. In a particular embodiment, the photoresist 262, comprises SnOC.

The photoresist 262 may be disposed over the surface of the substrate 261 using any suitable deposition process. In an embodiment, the photoresist is disposed on the surface of the substrate 261 with a wet chemistry using a spin-on process. In an alternative embodiment, the photoresist is disposed on the surface of the substrate 261 using a vapor phase process (i.e., a dry process). In a vapor phase process, a metal precursor and an oxidant may be vaporized to a vacuum chamber, with the metal precursor and the oxidant reacting to deposit a metal oxo photoresist 262 on the surface of the substrate 261. Such dry processes may be characterized as a chemical vapor deposition (CVD) process, an atomic layer deposition (ALD) process, a plasma enhanced CVD (PE-CVD) process, or a plasma enhanced ALD (PE-ALD) process.

In an embodiment, process 120 may continue with operation 122 which comprises exposing portions of the metal oxo photoresist to create exposed regions and unexposed regions. FIG. 2B is a cross-sectional illustration depicting the exposure process. As shown, electromagnetic radiation 264 passes through a mask 263 to expose the exposed regions $262_E$. The unexposed regions $262_U$ are blocked from the electromagnetic radiation by the mask 263. In an embodiment, the electromagnetic radiation is EUV radiation. When EUV radiation is used, the EUV radiation 264 may be reflected off the mask instead of passing through the mask. While EUV radiation specifically disclosed herein, it is to be appreciated that any suitable wavelength of electromagnetic radiation that can initiate a solubility switch in the metal oxo photoresist 262 may be used. For example, DUV radiation may be used in some embodiments.

In an embodiment, the solubility switch is provided by the loss of carbon. Particularly, the exposure to electromagnetic radiation results in the removal of carbon from the exposed regions $262_E$. The higher carbon content in the unexposed regions $262_U$ renders the unexposed regions more susceptible to etching in the subsequent vapor phase development process.

In an embodiment, process 120 may continue with operation 123 which comprises placing the substrate into a vacuum chamber. In an embodiment, the vacuum chamber may be any suitable chamber for providing sub-atmospheric pressure conditions. The vacuum chamber may also include heating/cooling features to provide thermal control of the vapor phase process. For example, a pedestal on which the substrate 261 is placed may be an actively heated and/or cooled pedestal. Additionally, walls of the vacuum chamber may be actively heated and/or cooled in some embodiments.

Particularly, it is to be appreciated that embodiments disclosed herein do not require a plasma source in order to implement the vapor phase etching of the metal oxo photoresist. Accordingly, the construction of the vacuum chamber may be simplified compared to processes that include plasma based developing of the metal oxo photoresist. A more detailed description of a suitable vacuum chamber is provided below with respect to FIG. 7.

In an embodiment, process 120 may continue with operation 124 which comprises vaporizing a halogenating agent into the vacuum chamber. In an embodiment, the halogenating agent reacts with the unexposed regions $262_U$ to produce a volatile byproduct. That is, the reaction between the halogenating agent and the unexposed regions $262_U$ results in the removal of the unexposed regions $262_U$ from the substrate 261, as shown in FIG. 2C. In other embodiments, the halogenating agent may react with the exposed regions $262_E$ to produce a volatile byproduct. In an embodiment, the byproduct of the reaction is a volatile metal halide. Some metal halides have higher volatilities than others. For example $SnCl_4$ has a higher volatility than $SnCl_2$, CoClL (where L is a ligand) has a higher volatility than $CoCl_2$, and $MoOCl_4$ has a higher volatility than $MoCl_5$. Accordingly, the reaction may preferentially result in the formation of byproducts with higher volatilities. In an embodiment the byproducts may have the chemical formula $MX_x$ or $MO_yX_x$, where M is a metal or semimetal, X is a halide, x is 1-6 and y is 1-5.

In an embodiment, the halogenating agent is a metal halide with a formula $MX_a$ or $MX_aL_b$, where M is a metal or semimetal (e.g., Mo, W, Ta, Nb, Sn, V, Ti, or Si), X is a halide (e.g., Cl or Br), L is a volatile ligand (e.g., alkyls, ethylenediamine, or Cp), a is 1-6 and b is 1-5. For example, the metal halide may comprise $MoCl_5$, $TaCl_5$, $NbCl_5$ or $WCl_5$.

In an additional embodiment, the halogenating agent is a metal oxy halide with a formula $MO_aX_b$ or $MO_aX_bL_c$, where M is a metal or semimetal (e.g., Mo, W, Ta, Nb, Sn, V, Ti, or Si), X is a halide (e.g., Cl or Br), L is a volatile ligand (e.g., alkyls ethylenediamine, or Cp), a is 1-5, b is 1-5, and c is 1-5. For example, the metal oxy halide may comprise $MoOCl_4$, $MoO_2Cl_2$, $WOCl_4$, or $WO_2Cl_2$.

In yet another additional embodiment, the halogenating agent may be an organic halogenating agent. For example, the halogenating agent may comprise thionyl chloride ($SOCl_2$), methanesulfonyl chloride ($CH_3SO_2Cl$), trichloromethanesulfonyl chloride ($CCl_3SO_2Cl$), 4-toluenesulfonyl chloride (tosyl chloride), oxalyl chloride (ClCOCOCl), tert-butyl hypochlorite (($CH_3$)$_3$COCl), N-chlorophthalimide, 1,3-dichloro-5,5-dimethylhydantoin, trimethylsilyl chloride, HCl, $Cl_2$, $PCl_5$, $BCl_3$, HBr, $Br_2$, $CCl_3Br$, $CBr_4$, 1,2-dibromo-1,1,2,2-tetrachloroethane ($Cl_2CBrCBrCl_2$), $BBr_3$, $PBr_3$, N-bromosuccinimide, N-bromoacetamide, 2-bromo-2-cyano-N,N-dimethylacetamide, 1,3-dibromo-5,5-dimethylhydantoin, 2,4,4,6-tetrabromo-2,5-cyclohexadienone, or trimethylsilyl bromide.

In yet another embodiment, the halogenating agent may comprise one or more of $SOBr_2$ (thionyl bromide), $SO_2Cl_2$ (sulfuryl chloride), and $SO_2Br_2$ (sulfuryl bromide).

In an embodiment, the halogenating agent may be diluted with an inert gas. For example, inert gases such as Ar, $N_2$, or He may be used to dilute the halogenating agent. Generally, it has been shown that the etch selectivity of the unexposed regions of the photoresist $262_U$ relative to the exposed regions of the photoresist $262_E$ increases with increases in pressure. In an embodiment, the pressure may be between approximately 1 torr and approximately 100 torr. In a particular embodiment, the pressure may be between approximately 3 torr and approximately 10 torr.

In an embodiment, the substrate 261 may have a controlled temperature during operation 124. For example, the temperature may vary between approximately 0° C. and approximately 500° C. In a particular embodiment, the temperature may vary between approximately 50° C. and approximately 200° C. Generally, it has been shown that increased substrate temperatures provide an increase in the etch selectivity of the unexposed regions of the photoresist $262_U$ relative to the exposed regions of the photoresist $262_E$.

In an embodiment process 120 may continue with operation 125 which comprises purging the vacuum chamber. Purging the vacuum chamber removes the byproducts from the reaction in operation 124 from the vacuum chamber. In an embodiment, operation 124 may be implemented as a soak followed by a single purge in operation 125. In alternative embodiments, operations 124 and 125 may define a cycle comprising a pulse of the halogenating agent followed by a purge. In such embodiments, a plurality of cycles may be repeated in order to clear the unexposed regions of the photoresist $262_U$.

Figure 3:
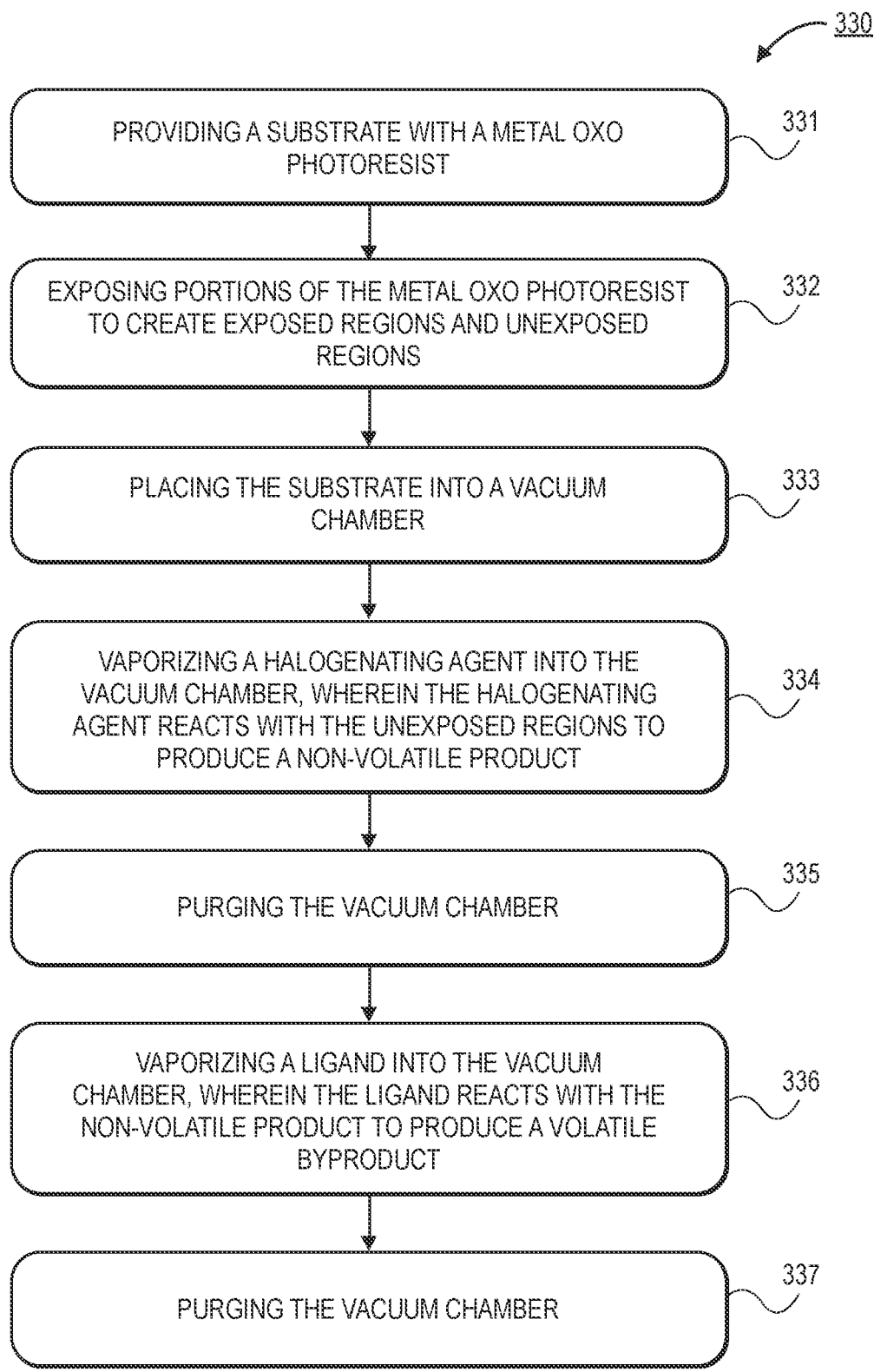
FIG. 3 is a flowchart describing a process for developing a metal oxo photoresist using a vapor phase process with a halogenating agent and a protonated ligand, in accordance with an embodiment of the present disclosure.
Figure 4A:
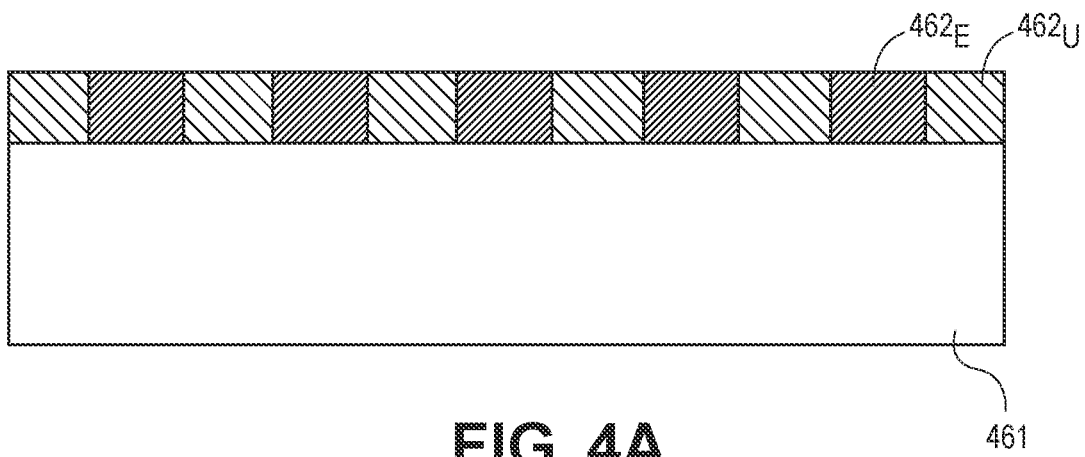
FIGS. 4A-4C are cross-sectional illustrations of a substrate and a photoresist depicting operations in the flowchart of FIG. 3, in accordance with an embodiment of the present disclosure.
Figure 4B:
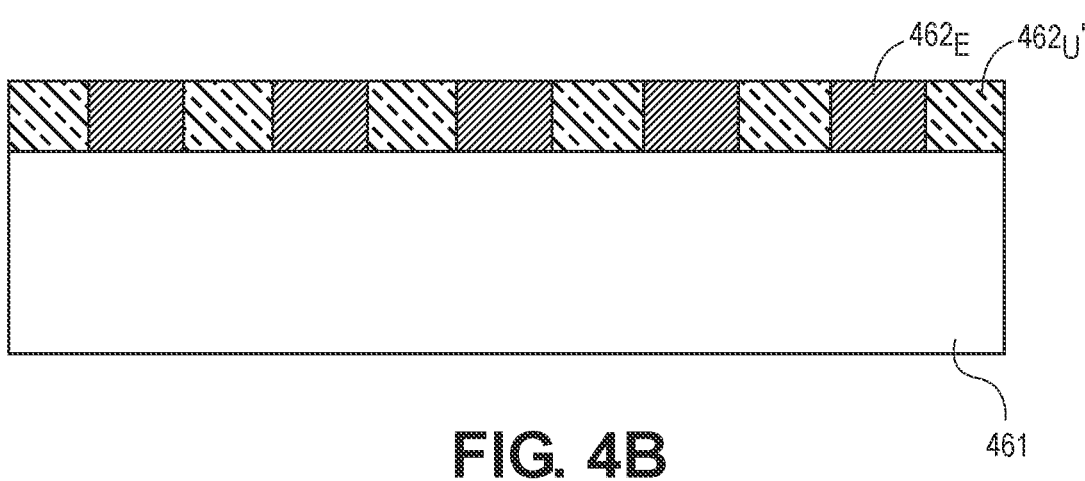
Figure 4C:
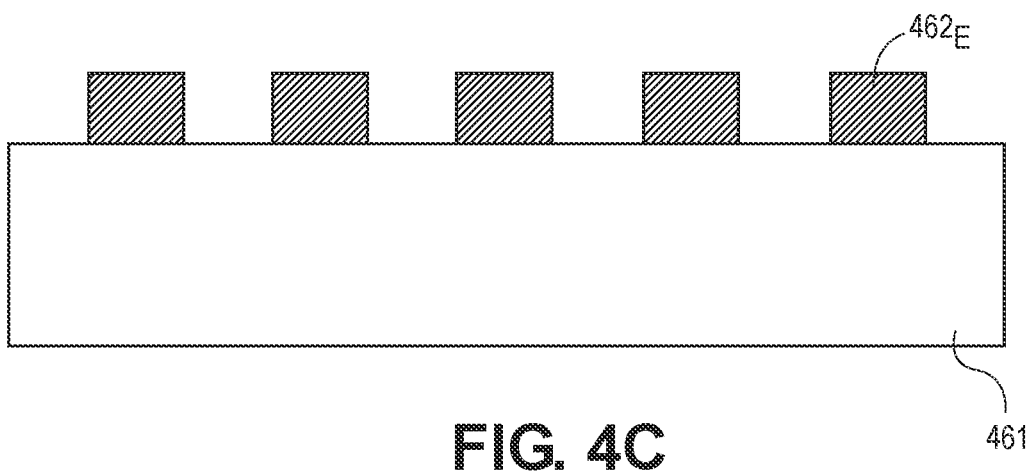

Referring now to FIG. 3, a flowchart describing a process 330 for patterning a metal oxo photoresist is shown, in accordance with an embodiment of the present disclosure. FIGS. 4A-4C are corresponding cross-sectional illustrations depicting various processing operations in process 330. In an embodiment, process 330 may be beneficial when the halogenating agent is not able to fully convert the unexposed regions of the photoresist into a volatile byproduct. Particularly, process 330 further comprises vaporizing a protonated ligand into the vacuum chamber to convert unexposed regions of the photoresist into a volatile byproduct.

In an embodiment, process 330 may begin with operation 331, which comprises providing a substrate with a metal oxo photoresist. In an embodiment, the substrate and metal oxo photoresist may be substantially similar to the substrate and metal oxo photoresist described above with respect to operation 121 of process 120.

In an embodiment, process 330 may continue with operation 332, which comprises exposing portions of the metal oxo photoresist to create exposed regions and unexposed regions. In an embodiment, the exposure process of operation 332 may be substantially similar to the exposure process of operation 122 of process 120. FIG. 4A provides a cross-sectional illustration of the substrate 461 and exposed regions of the photoresist $462_E$ and unexposed regions of the photoresist $462_U$.

In an embodiment, process 330 may continue with operation 333, which comprises placing the substrate into a vacuum chamber. The vacuum chamber used in process 330 may be substantially similar to the vacuum chamber used in process 120.

In an embodiment, process 330 may continue with operation 334, which comprises vaporizing a halogenating agent into the vacuum chamber. In an embodiment, the halogenating agent may react with the unexposed regions of the photoresist $462_U$ to provide a non-volatile product $462_U'$. That is, in some embodiments, the halogenating agent, by itself, is not able to fully convert the unexposed regions of the photoresist $462_U$ into a volatile product that is removable from the vacuum chamber. In other embodiments, the halogenating agent may react with the exposed regions $462_E$ to produce a non-volatile product. In an embodiment, the non-volatile product $462_U'$ may be a metal halide or a metal oxy halide with a chemical formula of $MX_x$ or $MO_yX_x$, where M is a metal or semimetal, X is a halide, x is 1-6 and y is 1-5.

In an embodiment, the halogenating agent is a metal halide with a formula $MX_a$ or $MX_aL_b$, where M is a metal or semimetal (e.g., Mo, W, Ta, Nb, Sn, V, Ti, or Si), X is a halide (e.g., Cl or Br), L is a volatile ligand (e.g., alkyls ethylenediamine, or Cp), a is 1-6 and b is 1-5. For example, the metal halide may comprise $MoCl_5$, $TaCl_5$, $NbCl_5$ or $WCl_5$.

In an additional embodiment, the halogenating agent is a metal oxy halide with a formula $MO_aX_b$ or $MO_aX_bL_c$, where M is a metal or semimetal (e.g., Mo, W, Ta, Nb, Sn, V, Ti, or Si), X is a halide (e.g., Cl or Br), L is a volatile ligand (e.g., alkyls ethylenediamine, or Cp), a is 1-5, b is 1-5, and c is 1-5. For example, the metal oxy halide may comprise $MoOCl_4$, $MoO_2Cl_2$, $WOCl_4$, or $WO_2Cl_2$.

In yet another additional embodiment, the halogenating agent may be an organic halogenating agent. For example, the halogenating agent may comprise thionyl chloride ($SOCl_2$), methanesulfonyl chloride ($CH_3SO_2Cl$), trichloromethanesulfonyl chloride ($CCl_3SO_2Cl$), 4-toluenesulfonyl chloride (tosyl chloride), oxalyl chloride ($ClCOCOCl$), tert-butyl hypochlorite ($(CH_3)_3COCl$), N-chlorophthalimide, 1,3-dichloro-5,5-dimethylhydantoin, trimethylsilyl chloride, HCl, $Cl_2$, $PCl_5$, $BCl_3$, HBr, $Br_2$, $CCl_3Br$, $CBr_4$, 1,2-dibromo-1,1,2,2-tetrachloroethane ($Cl_2CBrCBrCl_2$), $BBr_3$, $PBr_3$, N-bromosuccinimide, N-bromoacetamide, 2-bromo-2-cyano-N,N-dimethylacetamide, 1,3-dibromo-5,5-dimethylhydantoin, 2,4,4,6-tetrabromo-2,5-cyclohexadienone, or trimethylsilyl bromide.

In an embodiment, the halogenating agent may be diluted with an inert gas. For example, inert gases such as Ar, $N_2$, or He may be used to dilute the halogenating agent. In an embodiment, the pressure may be between approximately 1 torr and approximately 100 torr. In a particular embodiment, the pressure may be between approximately 5 torr and approximately 10 torr. In an embodiment, the substrate 461 may have a controlled temperature during operation 334. For example, the temperature may vary between approximately 0° C. and approximately 500° C. In a particular embodiment, the temperature may vary between approximately 50° C. and approximately 150° C.

In an embodiment, process 330 may continue with operation 335, which comprises purging the vacuum chamber with an inert purge. In an embodiment, the purging process removes any byproducts and unreacted halogenating agent.

In an embodiment, process 330 may continue with operation 336, which comprises vaporizing a ligand into the vacuum chamber. In an embodiment, the ligand reacts with the non-volatile product $462_U'$ to produce a volatile byproduct. That is, the reaction between the vaporized ligand and the non-volatile product $462_U'$ results in the removal of the unexposed regions from the substrate 461, as shown in FIG. 4C. In cases when the non-volatile product is generated from the exposed regions $462_E$, the exposed regions may be removed from the substrate 461. In an embodiment, the ligand is a protonated ligand, such as amine. In an embodiment, the ligand may be diluted with an inert gas such as Ar, $N_2$, or He. In an embodiment, the volatile byproduct may have the chemical formula $MX_xL_y$ or $MO_xX_yL_z$, where M is a metal or semimetal (e.g., Mo, W, Ta, Nb, Sn, V, Ti, or Si), X is a halide (e.g., Cl or Br), L is a volatile ligand (e.g., amine), x is 1-5, y is 1-5, and z is 1-5.

In an embodiment, the pressure may be between approximately 1 torr and approximately 100 torr. In a particular embodiment, the pressure may be between approximately 5 torr and approximately 10 torr. In an embodiment, the substrate 461 may have a controlled temperature during operation 336. For example, the temperature may vary between approximately 0° C. and approximately 500° C. In a particular embodiment, the temperature may vary between approximately 50° C. and approximately 150° C.

In an embodiment, process 330 may continue with operation 337, which comprises purging the vacuum chamber. Purging with an inert gas may result in the removal of volatile byproducts and remaining vaporized ligands.

In an embodiment, operations 334-337 may define a cycle. The cycle may be repeated any number of times in order to fully (or substantially) remove the unexposed regions $462_U$ of the metal oxo photoresist. For example, a cycle may comprise a sequence including a pulse of a vaporized halogenating agent being introduced into the vacuum chamber, followed by an inert purge, followed by a pulse of a vaporized ligand being introduced into the vacuum chamber, followed by an inert purge. In other embodiments, a single cycle may be used. In such embodiments, a soak of the vaporized halogenating agent may be introduced into the vacuum chamber, followed by an inert purge, followed by a soak of a vaporized ligand into the vacuum chamber, followed by an inert purge.

Generally, it has been shown that the etch selectivity of the unexposed regions of the photoresist $462_U$ relative to the exposed regions of the photoresist $462_E$ increases with increases in pressure. Additionally, it has been generally shown that increased substrate temperatures during one or more of operations 334-337 provide an increase in the etch selectivity of the unexposed regions of the photoresist $462_U$ relative to the exposed regions of the photoresist $462_E$.

Figure 5:
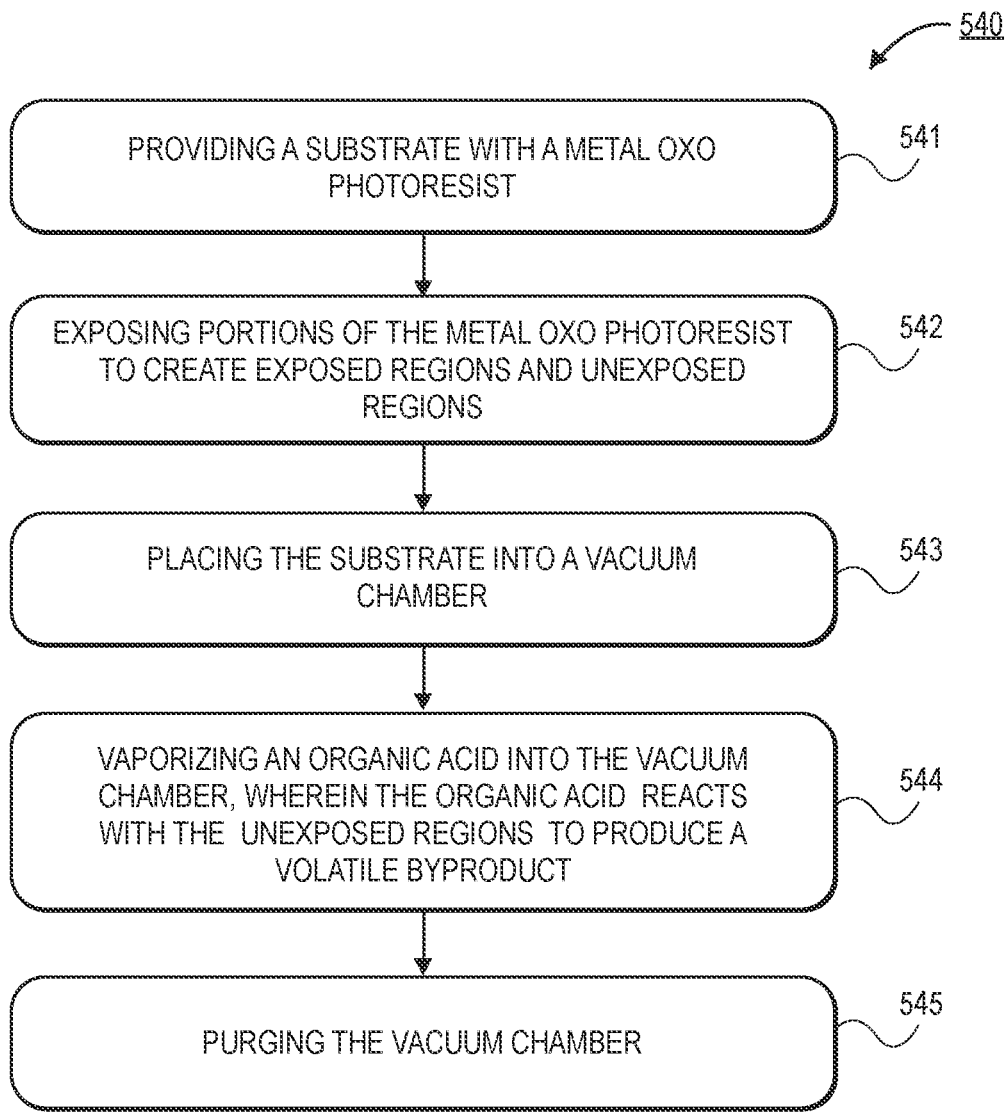
FIG. 5 is a flowchart describing a process for developing a metal oxo photoresist using a vapor phase process with an organic acid, in accordance with an embodiment of the present disclosure.
Figure 6A:
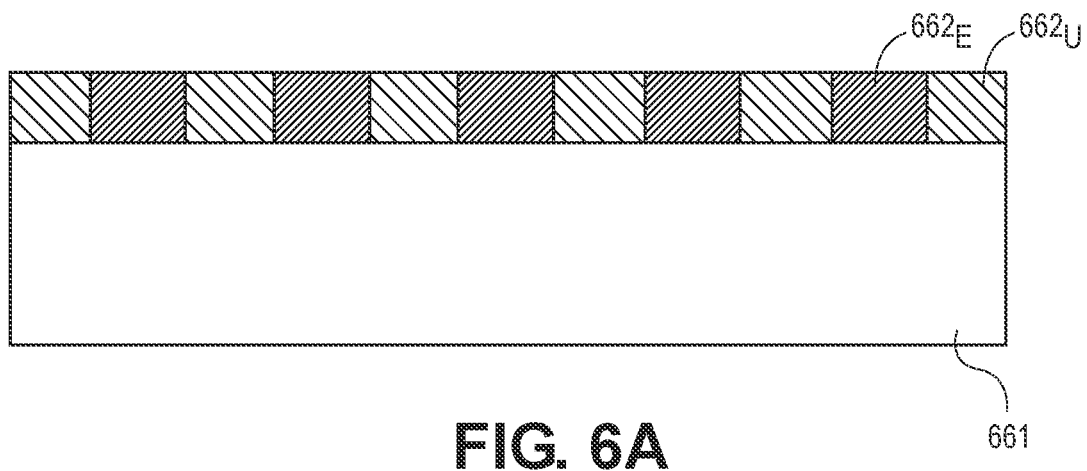
FIGS. 6A and 6B are cross-sectional illustrations of a substrate and a photoresist depicting operations in the flowchart of FIG. 5, in accordance with an embodiment of the present disclosure.
Figure 6B:
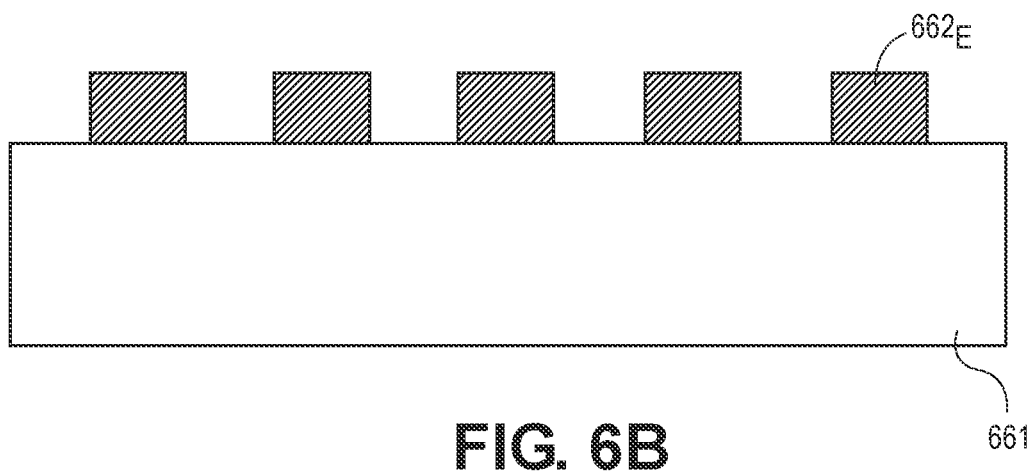

Referring now to FIG. 5, a flowchart describing a process 540 for patterning a metal oxo photoresist is shown, in accordance with an embodiment of the present disclosure. FIGS. 6A-6B are corresponding cross-sectional illustrations depicting various processing operations in process 540. In an embodiment, process 540 may be similar to the process 120, with the exception that the halogenating agent is replaced with a vaporized organic acid. That is, an organic acid is vaporized to a vacuum chamber, where the organic acid reacts with either the unexposed or exposed regions of the metal oxo photoresist to produce a volatile byproduct.

In an embodiment, process 540 may begin with operation 541, which comprises providing a substrate with a metal oxo photoresist. In an embodiment, the substrate and metal oxo photoresist may be substantially similar to the substrate and metal oxo photoresist described above with respect to operation 121 of process 120.

In an embodiment, process 540 may continue with operation 542, which comprises exposing portions of the metal oxo photoresist to create exposed regions and unexposed regions. In an embodiment, the exposure process of operation 542 may be substantially similar to the exposure process of operation 122 of process 120. FIG. 6A provides a cross-sectional illustration of the substrate 661 and exposed regions of the photoresist $662_E$ and unexposed regions of the photoresist $662_U$.

In an embodiment, process 540 may continue with operation 543, which comprises placing the substrate into a vacuum chamber. The vacuum chamber used in process 540 may be substantially similar to the vacuum chamber used in process 120.

In an embodiment, process 540 may continue with operation 544, which comprises vaporizing an organic acid into the vacuum chamber. In an embodiment, the organic acid reacts with either the unexposed regions $662_U$ or the exposed regions $662_E$ to produce a volatile byproduct. That is, the reaction between the organic acid and the unexposed regions $662_U$ results in the removal of the unexposed regions $662_U$ from the substrate 661 (as shown in FIG. 6B), or the reaction between the organic acid and the exposed regions $662_E$ results in the removal of the exposed regions $662_E$ from the substrate 661.

In an embodiment, the organic acid may be a carboxylic acid with a chemical formula $RCO_2H$. For example, R may be H, $CH_3$, tBu, or iPr. In an embodiment, the byproduct of the reaction is a volatile carboxylate. For example, the carboxylate may have a chemical formula $M(RCO_2)_x$, where M is the metal from the metal oxo photoresist and R is the R used in the organic acid.

In an embodiment, the organic acid may be diluted with an inert gas. For example, inert gases such as Ar, $N_2$, or He may be used to dilute the organic acid. Generally, it has been shown that the etch selectivity of the unexposed regions of the photoresist $262_U$ relative to the exposed regions of the photoresist $262_E$ increases with increases in pressure. In an embodiment, the pressure may be between approximately 1 torr and approximately 100 torr. In a particular embodiment, the pressure may be between approximately 5 torr and approximately 10 torr.

In an embodiment, the substrate 661 may have a controlled temperature during operation 544. For example, the temperature may vary between approximately 0° C. and approximately 500° C. In a particular embodiment, the temperature may vary between approximately 50° C. and approximately 150° C. Generally, it has been shown that increased substrate temperatures provide an increase in the etch selectivity of the unexposed regions of the photoresist $662_U$ relative to the exposed regions of the photoresist $662_E$.

In an embodiment process 540 may continue with operation 545 which comprises purging the vacuum chamber. Purging the vacuum chamber removes the byproducts from the reaction in operation 544 from the vacuum chamber. In an embodiment, operation 544 may be implemented as a soak followed by a single purge in operation 545. In alternative embodiments, operations 544 and 545 may define a cycle comprising a pulse of the organic acid followed by a purge. In such embodiments, a plurality of cycles may be repeated in order to clear the unexposed regions of the photoresist $662_U$.

Accordingly, embodiments described herein include thermal vapor phase processes for developing a metal oxo photoresist. As such, embodiments disclosed herein may not require vacuum chambers with the ability to form a plasma. The removal of a plasma process also reduces damage to the metal oxo photoresist. This is especially beneficial at low photoresist thicknesses (e.g., at photoresist thicknesses of approximately 15 nm or smaller). At low photoresist thicknesses plasma damage may result in poor LER/LWR or even broken line patterns when the pattern is transferred into the underlayer.

Additionally, wet chemistries are avoided, and byproducts generated by the reactions disclosed herein may be destroyed with abatement systems typical of the semiconductor manufacturing industry. As such, waste streams are significantly reduced. Furthermore, vapor phase processes allow for fewer defects and impurities in the resulting developed metal oxo photoresist, especially at small feature sizes, since wet chemistries are not used.

Figure 7:
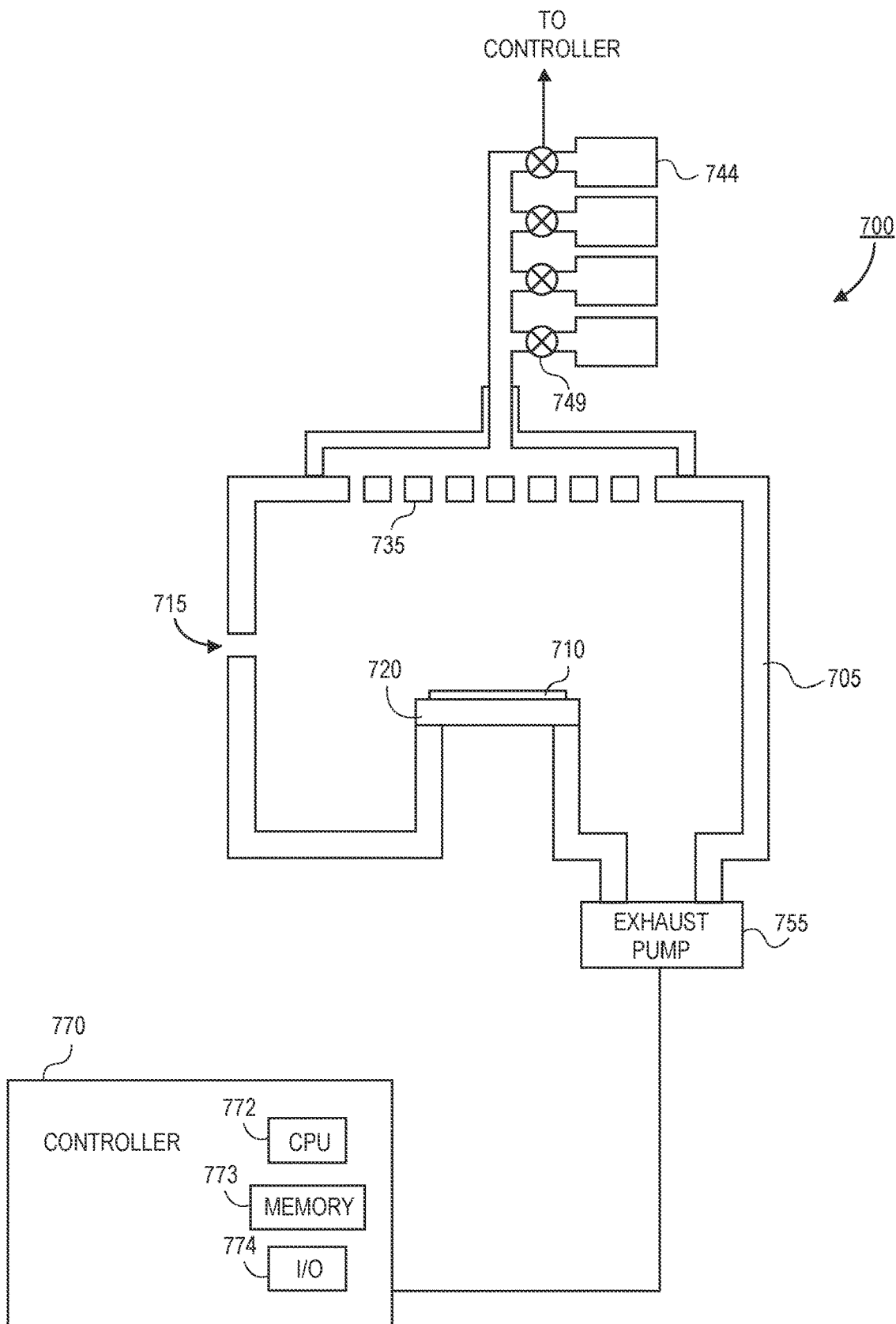
FIG. 7 is a cross-sectional illustration of a processing tool that may be used to implement portions of the process in FIG. 1, FIG. 3, or FIG. 5, in accordance with an embodiment of the present disclosure.

FIG. 7 is a schematic of a vacuum chamber configured to develop the unexposed regions of a metal oxo photoresist, in accordance with an embodiment of the present disclosure. Vacuum chamber 700 includes a grounded chamber 705. In an embodiment, the chamber 705 may be temperature controlled. That is, walls of the chamber 705 may be actively cooled or heated during processes disclosed herein. A substrate 710 is loaded through an opening 715 and positioned on a temperature controlled pedestal 720.

Process gases, are supplied from gas sources 744 through respective mass flow controllers 749 to the interior of the chamber 705. In certain embodiments, a gas distribution plate 735 provides for distribution of process gases 744, such as, for example, halogenating agents, ligands, organic acids, and/or inert gases. Chamber 705 is evacuated via an exhaust pump 755.

The vacuum chamber 700 is controlled by controller 770. The controller 770 may comprise a CPU 772, a memory 773, and an I/O interface 774. The CPU 772 may execute processing operations within the vacuum chamber 700 in accordance with instructions stored in the memory 773. For example, one or more processes such as processes 120, 330, and 540 described above may be executed in the vacuum chamber by the controller 770.

While the vacuum chamber 700 is described above as not having features suitable for forming a plasma within the chamber, it is to be appreciated that embodiments of the present disclosure may be implemented in a vacuum chamber 700 that is capable of generating a plasma within the chamber.

Figure 8:
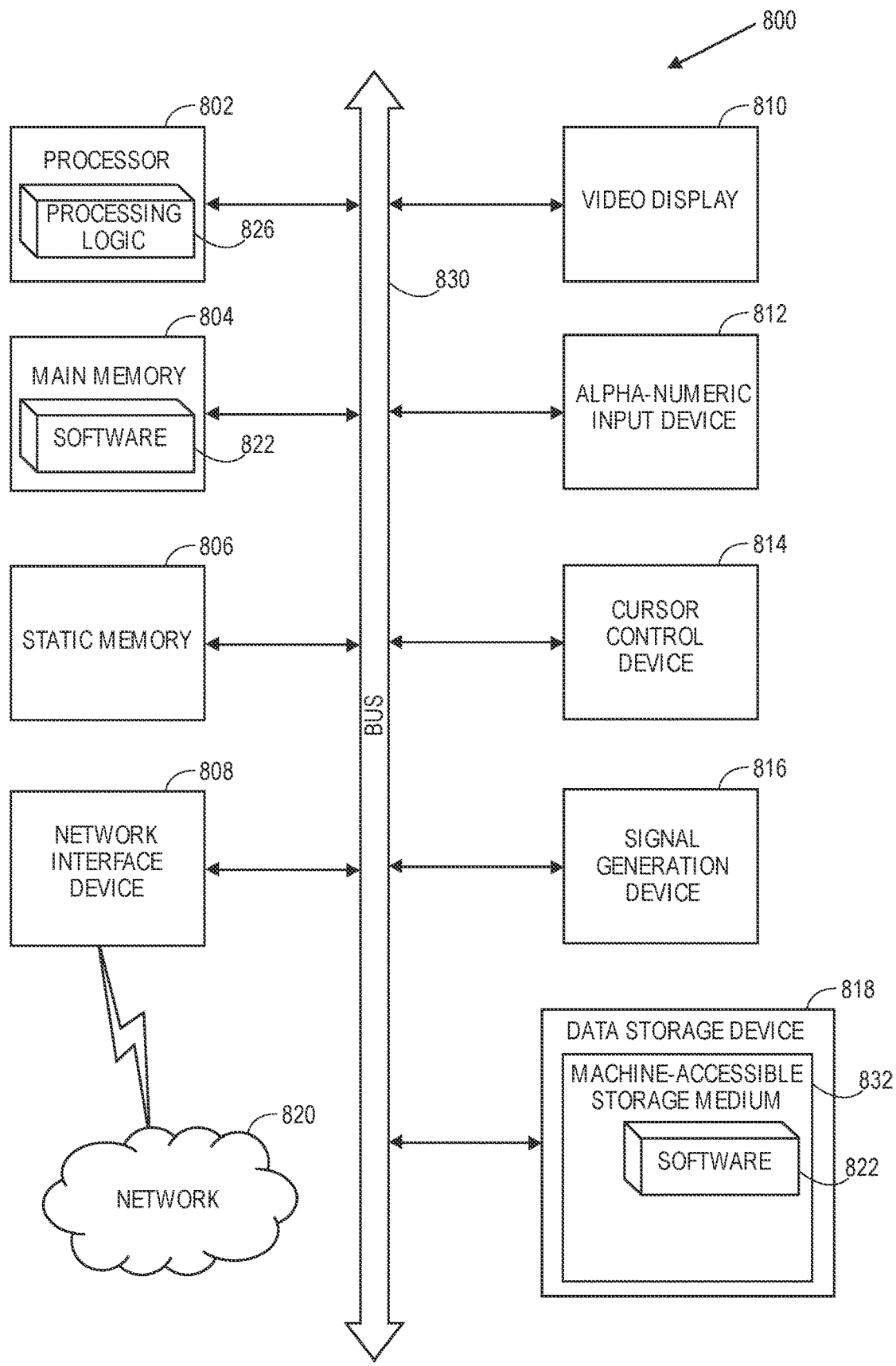
FIG. 8 illustrates a block diagram of an exemplary computer system, in accordance with an embodiment of the present disclosure.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), MRAM, etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of developing a metal oxo photoresist on a substrate with vapor phase processes. The method includes exposing a metal oxo photoresist to provide exposed and unexposed regions, and placing a substrate with the exposed photoresist into a vacuum chamber. In an embodiment, a gas reactive to the unexposed regions of the photoresist is vaporized into the vacuum chamber. For example, the reactive gas may comprise one or more of a halogenating agent, a ligand, and an organic acid. The reactive gas and the unexposed regions of the metal oxo photoresist react to form a volatile byproduct. The byproduct may be removed from the chamber with an inert gas purge.

Thus, methods for forming a developing a metal oxo photoresist using vapor phase processes have been disclosed.

What is claimed is:

1. A method of developing a metal oxo photoresist, comprising:
providing a substrate with the metal oxo photoresist into a vacuum chamber, wherein the metal oxo photoresist comprises exposed regions and unexposed regions;
vaporizing a halogenating agent into the vacuum chamber, wherein the halogenating agent reacts with either the unexposed regions or the exposed regions to produce a volatile byproduct, wherein the halogenating agent comprises $MoCl_5$, $TaCl_5$, $NbCl_5$, or $WCl_5$; and
purging the vacuum chamber.

2. A method of developing a metal oxo photoresist, comprising:
providing a substrate with the metal oxo photoresist into a vacuum chamber, wherein the metal oxo photoresist comprises exposed regions and unexposed regions;
vaporizing a halogenating agent into the vacuum chamber, wherein the halogenating agent reacts with either the unexposed regions or the exposed regions to produce a volatile byproduct, wherein the halogenating agent comprises a metal oxy halide with a formula of $MO_aX_b$ or $MO_aX_bL_c$, wherein M is a metal or semimetal including one or more of Mo, W, Ta, Nb, Sn, V, Ti, or Si, wherein X is a halide including one or more of Cl and Br, and wherein L is a ligand including one or more of an alkyl, an ethylenediamine, or Cp; and
purging the vacuum chamber.

3. The method of claim 2, wherein the halogenating agent comprises $MoOCl_4$, $MoO_2Cl_2$, $WOCl_4$, or $WOCl_2$.

4. The method of claim 2, wherein a is 1-5, b is 1-5, and c is 1-5.

5. A method of developing a metal oxo photoresist, comprising:
providing a substrate with the metal oxo photoresist into a vacuum chamber;
vaporizing a halogenating agent into the vacuum chamber, wherein the halogenating agent reacts with the metal oxo photoresist to produce a volatile byproduct; and
purging the vacuum chamber, wherein the halogenating agent comprises a metal halide or a metal oxy halide, wherein the halogenating agent comprises a metal oxy halide with a formula of $MO_aX_b$ or $MO_aX_bL_c$, wherein M is a metal or semimetal including one or more of Mo, W, Ta, Nb, Sn, V, Ti, or Si, wherein X is a halide including one or more of Cl and Br, and wherein L is a ligand including one or more of an alkyl, an ethylenediamine, or Cp.

6. A method of developing a metal oxo photoresist, comprising:
- providing a substrate with the metal oxo photoresist into a vacuum chamber;
- vaporizing a halogenating agent into the vacuum chamber, wherein the halogenating agent reacts with the metal oxo photoresist to produce a non-volatile product;
- vaporizing a ligand into the vacuum chamber, wherein the ligand reacts with the non-volatile product to produce a volatile byproduct; and
- purging the vacuum chamber.

7. The method of claim 6, wherein the halogenating agent comprises a metal halide.

8. The method of claim 6, wherein the halogenating agent comprises a metal oxy halide.

9. The method of claim 6, wherein the halogenating agent comprises thionyl chloride ($SOCl_2$), methanesulfonyl chloride ($CH_3SO_2Cl$), trichloromethanesulfonyl chloride ($CCl_3SO_2Cl$), 4-toluenesulfonyl chloride (tosyl chloride), oxalyl chloride (ClCOCOCl), tert-butyl hypochlorite (($CH_3$)$_3COCl$), N-chlorophthalimide, 1,3-dichloro-5,5-dimethylhydantoin, trimethylsilyl chloride, HCl, $Cl_2$, $PCl_5$, $BCl_3$, HBr, $Br_2$, $CCl_3Br$, $CBr_4$, 1,2-dibromo-1,1,2,2-tetrachloroethane ($Cl_2CBrCBrCl_2$), $BBr_3$, $PBr_3$, N-bromosuccinimide, N-bromoacetamide, 2-bromo-2-cyano-N,N-dimethylacetamide, 1,3-dibromo-5,5-dimethylhydantoin, 2,4,4,6-tetrabromo-2,5-cyclohexadienone, or trimethylsilyl bromide.

10. The method of claim 6, wherein the ligand is a protonated ligand, comprising an amine.

* * * * *